(12) United States Patent
Suzuki et al.

(10) Patent No.: US 8,134,841 B2
(45) Date of Patent: Mar. 13, 2012

(54) PRINTED-WIRING BOARD, METHOD OF MANUFACTURING PRINTED-WIRING BOARD, AND ELECTRONIC EQUIPMENT

(75) Inventors: Daigo Suzuki, Yokohama (JP); Minoru Takizawa, Sagamihara (JP); Nobuhiro Yamamoto, Fussa (JP); Hidenori Tanaka, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1081 days.

(21) Appl. No.: 11/959,232

(22) Filed: Dec. 18, 2007

(65) Prior Publication Data

US 2008/0151516 A1 Jun. 26, 2008

(30) Foreign Application Priority Data

Dec. 22, 2006 (JP) ................. 2006-346512

(51) Int. Cl.
*H05K 1/18* (2006.01)
(52) U.S. Cl. ......... 361/761; 361/763; 361/766; 361/795
(58) Field of Classification Search .......... 361/763–766, 361/793–795
See application file for complete search history.

(56) References Cited

U.S. PATENT DOCUMENTS

| | | | |
|---|---|---|---|
| 6,724,638 B1 * | 4/2004 | Inagaki et al. ................ | 361/763 |
| 6,765,299 B2 | 7/2004 | Takahashi et al. | |
| 7,176,055 B2 | 2/2007 | Tsukahara et al. | |
| 7,528,005 B2 | 5/2009 | Takahashi et al. | |
| 7,532,453 B2 * | 5/2009 | Yamamoto et al. ........ | 361/306.2 |
| 2001/0038151 A1 | 11/2001 | Takahashi et al. | |
| 2004/0082100 A1 | 4/2004 | Tsukahara et al. | |
| 2004/0219717 A1 | 11/2004 | Takahashi et al. | |
| 2007/0200217 A1 | 8/2007 | Tsukahara et al. | |

FOREIGN PATENT DOCUMENTS

| | | |
|---|---|---|
| JP | 4-130789 | 5/1992 |
| JP | H04-130789 | 5/1992 |
| JP | 2000-332057 | 11/2000 |
| JP | 2001-257310 | 9/2001 |
| JP | 2003-188198 | 7/2003 |
| JP | 2005-109307 | 4/2005 |
| JP | 2006-59852 | 3/2006 |
| JP | 2006-059852 | 3/2006 |
| JP | 2006-128226 | 5/2006 |
| JP | 2006-270082 | 10/2006 |

OTHER PUBLICATIONS

Notice of Reasons for Rejection mailed by the Japan Patent Office on Aug. 23, 2011 in corresponding Japanese patent app. No. 2006-346512 in 7 pages.

* cited by examiner

*Primary Examiner* — Tuan T Dinh
(74) *Attorney, Agent, or Firm* — Knobbe Martens Olson & Bear, LLP

(57) ABSTRACT

According to one embodiment, there is provided a printed-wiring board, includes a first base member including a component mounting face, a first electronic component with a through-electrode mounted on the component mounting face, a second base member stacked on the first base member via an insulating layer covering the first electronic component, a hole part provided in the second base member and communicating with the through-electrode of the first electronic component, and a second electronic component mounted on the second base member and circuit-connected directly to the through-electrode via the hole part.

8 Claims, 4 Drawing Sheets

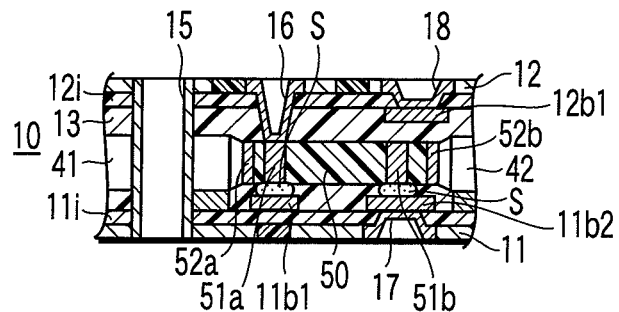
F I G. 11
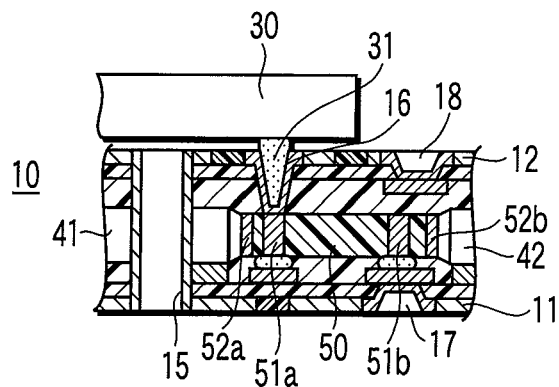
F I G. 12
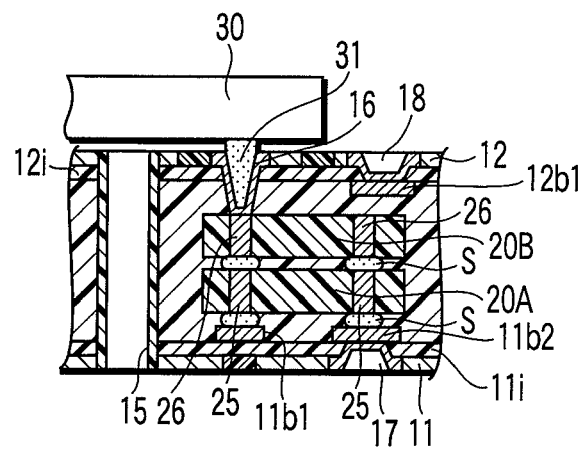
F I G. 13 ent for explaining an example of electrode junction of the printed-wiring board according to the second embodiment of the present invention;

FIG. 7 is a partial view showing a manufacturing step of a printed-wiring board according to a third embodiment of the present invention;

FIG. 8 is a partial view showing a manufacturing step of the printed-wiring board according to the third embodiment;

FIG. 9 is a partial view showing a manufacturing step of the printed-wiring board according to the third embodiment;

FIG. 10 is a partial view showing a manufacturing step of the printed-wiring board according to the third embodiment;

FIG. 11 is a partial view showing a manufacturing step of the printed-wiring board according to the third embodiment;

FIG. 12 is a partial view showing a manufacturing step of the printed-wiring board according to the third embodiment;

FIG. 13 is a partial view showing the configuration of a main part of a printed-wiring board according to a fourth embodiment of the present invention; and FIG. 14 is a perspective view showing a configuration of an electronic equipment according to an embodiment of the present invention.

PRINTED-WIRING BOARD, METHOD OF MANUFACTURING PRINTED-WIRING BOARD, AND ELECTRONIC EQUIPMENT

CROSS-REFERENCE TO RELATED APPLICATIONS

This application is based upon and claims the benefit of priority from Japanese Patent Application No. 2006-346512, filed Dec. 22, 2006, the entire contents of which are incorporated herein by reference.

BACKGROUND

1. Field

One embodiment of the present invention relates to a printed-wiring board incorporated with an electronic component, a method of manufacturing a printed-wiring board, and an electronic equipment.

2. Description of the Related Art

In a downsized electronic equipment such as a portable computer or a mobile terminal, a base board allowing high density wiring with a high degree of freedom of circuit design thereon and a component mounting technology to the base board taking reliability into account are demanded.

As a printed-wiring board that realizes high density wiring, there is a printed-wiring board with a multilayer stacking structure in which a part of a circuit component is embedded.

Conventionally, in a circuit design of a printed-wiring board of this type, circuit connection between terminals of an interior component and an exterior component has been performed via a wiring pattern, a through hole, or the like inherent in each terminal, as described in JP-A-2006-59852 (KO-KAI).

Conventionally, as described above, in a high density wiring board incorporating with components, since a wiring pattern, a through hole, or the like inherent in each terminal is required for circuit connection between terminals of the interior component and the exterior component, there is a problem that these wirings interfere with the high density circuit design and constitutes a factor decreasing the degree of freedom of wiring, which results in severer constraint on wiring density.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, there is provided a printed-wiring board, comprising: a first base member including a component mounting face; a first electronic component with a through-electrode mounted on the component mounting face; a second base member stacked on the first base member via an insulating layer covering the first electronic component; a hole part provided in the second base member and communicating with the through-electrode; and a second electronic component mounted on the second base member and circuit-connected directly to the through-electrode via the hole part.

Incidentally, though a printed-wiring board in each embodiment shown below is applicable to various multilayer printed-wiring boards with different numbers of layers, a printed-wiring board in which four-layer wiring is made possible by stacking two base members, each base member being formed on both faces with electrically-conducting layers, via an insulating layer is shown as an example here for ease of explanation.

Figure 4:
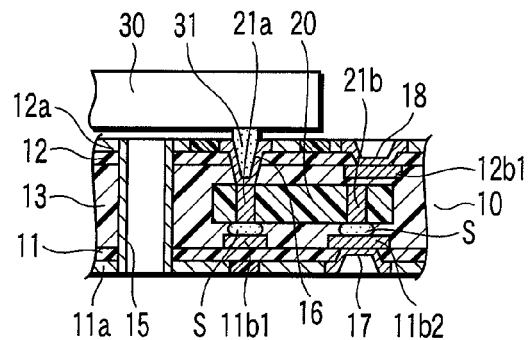
FIG. 4 is a partial view showing a final manufacturing step of the printed-wiring board according to the first embodiment.

A configuration of a main part of a printed-wiring board according to a first embodiment of the present invention is shown in FIG. 4.

As shown in FIG. 4, a printed-wiring board 10 according to the first embodiment of the present invention is configured to include a first base member 11 including a component mounting face, an electronic component such as a built-in component 20 with through-electrodes 21a and 21b mounted on the component mounting face of the first base member 11, a second base member 12 stacked on the first base member 11 via an insulating layer 13 covering the built-in component 20, a via hole conductor 16 provided in the second base member 12 and formed in a hole part communicating with the through-electrode 21a of the built-in component 20 to be joined to the through-electrode 21a of the built-in component 20, and a second electronic component such as an exterior component (surface-mount component) 30 mounted on the second base member 12 and circuit-connected directly to the through-electrode 21a of the built-in component 20 via the via hole conductor 16.

The built-in component 20 includes the plurality of (only two thereof are shown) through-electrodes 21a and 21b one ends of which are exposed on one face of the built-in component 20 and the other ends of which are exposed on the other face thereof. One ends of the through-electrodes 21a and 21b are joined to pads 11b1 and 11b2 provided on the inner surface side of the first base member 11, respectively, and the other end of the through-electrode 21a is joined to the via hole conductor 16 provided in the second base member 12.

In the first base member 11 and the second base member 12 of the printed-wiring board 10, wiring patterns including a pad, a land, and the like according to a pattern design are formed on outer surfaces and inner surfaces of the first base member 11 and the second base member 12, respectively.

Here, the pads 11b1 and 11b2 joined to the through-electrodes 21a and 21b exposed on the one face of the built-in component 20 are formed on the inner surface side of the first substrate 11.

The through-electrodes 21a and 21b exposed on one face of the built-in component 20 are joined to the pads 11b1 and 11b2 with solders S, respectively, so that the built-in component 20 is fixedly mounted on the pads 11b1 and 11b2 of the first base member 11. Of the pads 11b1 and 11b2, the pad 11b1 joined to the through-electrode 21a is a so-called open pad which is not circuit-connected to another wiring pattern. Incidentally, here, the pad 11b1 is provided on the first base member 11 as an open pad, but, in an actual configuration, the built-in component 20 is joined to a plurality of pads provided on the first base member 11 by solders so that it is fixedly mounted on the inner surface side of the first base member 11, and the pad 11b1 joined to the through-electrode 21a is not necessarily required.

Further, the printed-wiring board 10 is provided with a through-hole 15 extending through the first base member 11 and the second base member 12. A wiring pattern 11a according to the pattern design and a via hole conductor 17 joined to the pad 11b2 on the inner surface side are provided on the outer surface side of the first base member 11. Wiring patterns 12a and 12b1 according to the pattern design are provided on the outer surface side and the inner surface side of the second base member 12, respectively, and a via hole conductor 18 joined to the wiring pattern 12b1 on the inner surface side is provided on the outer surface side of the second base layer 12.

With such an electrode connection structure of the built-in component 20 utilizing the through-electrodes 21a and 21b of the built-in component 20, in interconnection between an IC (for example, a memory chip) serving as the built-in component 20 and an IC (for example, a CPU chip) serving as the exterior component (surface-mount component), direct circuit connection between the CPU chip and the memory chip is made, without requiring an additional wiring of a wiring patter including a through hole in the connection between the electrodes of the ICs.

Manufacturing steps of the printed-wiring board 10 according to the first embodiment of the present invention will be explained with reference to FIGS. 1-4.

Figure 1:
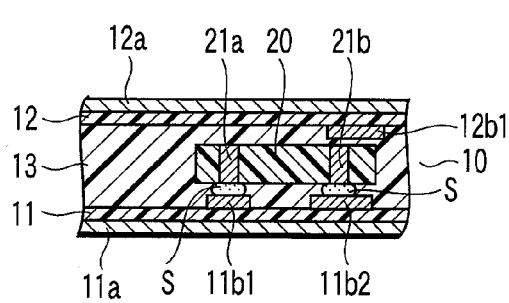
FIG. 1 is a partial view showing a manufacturing step of a printed-wiring board according to a first embodiment of the present invention.

At a step (step 1) shown in FIG. 1, a printed-wiring board 10 including a built-in component 20 inside between a first base member 11 and a second base member 12 is manufactured. At step 1, for example, according to reflow process, through-electrodes 21a and 21b of the built-in component 20 are joined to pads 11b1 and 11b2 provided on a component mounting face of the first base member 11 by solders S so that the built-in component 20 is fixedly mounted on the inner side of the first base member 11, and further the second base member 12 is stacked on the first base member 11 via an insulating layer 13 covering the built-in component 20, so that the printed-wiring board 10 including the built-in component 20 between the first base member 11 and the second base member 12 is manufactured. Incidentally, the pad 11b1 provided on the inner surface or the component mounting face of the first base member 11 is an open pad as described above. Further, joining means of the built-in component 20 to the first base member 11 is not limited to solder joining means utilizing solder balls or the like, and may be any joining means by, for example, Ag bump, Au bump, ACP (anisotropic conductive paste)/ACF (anisotropic conductive film), NCP (non-conductive paste)/NCF (non-conductive film), or the like.

Figure 2:
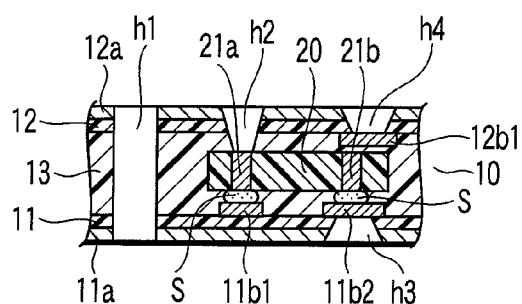
FIG. 2 is a partial view showing a manufacturing step of the printed-wiring board according to the first embodiment.

At a step (step 2) shown in FIG. 2, a tapered hole part h2 communicating with the through-electrode 21a of the built-in component 20 is bored in the second base member 12. At step 2, for example, by laser machining (or drill machining), the hole part h2 communicating with the through-electrode 21a exposed on the one face of the built-in component 20 is bored from the outer surface side of the second base member 12 toward the through-electrode 21a of the built-in component 20. Boring the hole part h2 is performed simultaneously at boring steps for respective a straight hole part h1, a tapered hole parts h3 and h4 such as another through-hole or another via hole.

Figure 3:
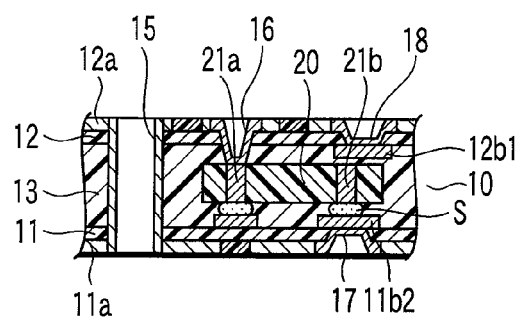
FIG. 3 is a partial view showing a manufacturing step of the printed-wiring board according to the first embodiment.

At a step (step 3) shown in FIG. 3, a through-hole conductor 15 and via hole conductors 16, 17, and 18 are formed in the respective hole parts h1 to h4 in the printed-wiring board 10 by performing conductor plating (copper plating) to the respective hole parts h1 to h4. At step 3, a via hole conductor 16 joined to the through-electrode 21a exposed on one face of the built-in component 20 is provided in the hole part h2 bored in the second base member 12. Further, a through hole conductor 15 extending through the first base member 11 and the second base member 12 is provided, a via hole conductor 17 joined to the pad 11b2 provided on the inner surface side of the first base member 11 is provided on the outer surface side of the first base member 11, and a via hole conductor 18 joined to a wiring pattern 12b1 provided on the inner surface side of the second base member 12 is provided on the outer surface side of the second base member 12. The via hole conductor 17 is joined to the pad 11b2 to which a through-electrode 21b of the built-in component 20 is joined by the solder S. Further, at step 3, a solder resist forming process is applied to a part required to be isolated on each wiring pattern.

At a step (step 4) shown in FIG. 4, for example, according to a known reflow process, a solder electrode 31 of an exterior component 30 is joined to the via hole conductor 16 to mount the exterior component 30 on the second base member 12. Whereby, the electrode 31 of the exterior component 30 and the through-electrode 21a of the built-in component 20 are directly circuit-connected and fixed to each other. Incidentally, the exterior component (surface-mount component) 30 may have any chip configurations such as BGA (ball grid array), LGA (land grid array), or QFP (quad flat package).

According to the embodiment of the present invention, it is possible to provide a printed-wiring board which allows circuit wiring with a high degree of freedom while achieving higher density in a circuit and taking into account voltage drop, signal leakage, and the like, which are caused by wiring of a wiring pattern, in a printed-wiring board including an built-in component.

Figure 5A:
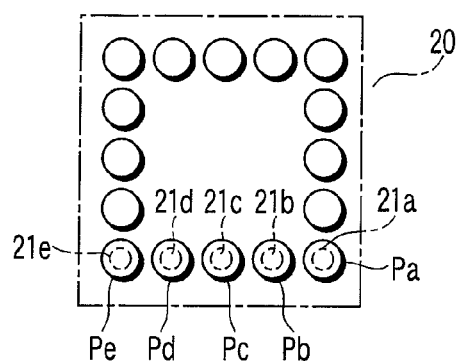
FIGS. 5A and 5B are views showing an electrode arrangement for explaining an example of electrode junction of a printed-wiring board according to a second embodiment of the present invention.
Figure 5B:
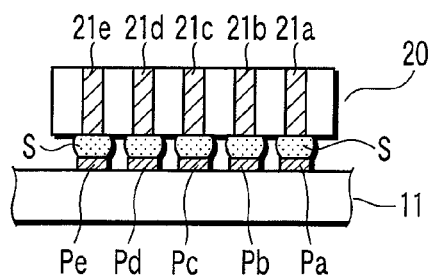
Figure 6A:
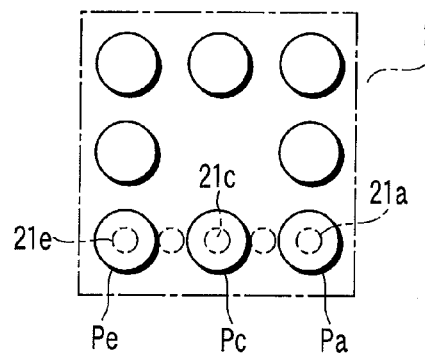
FIGS. 6A and 6B are views showing an electrode arrange-
Figure 6B:
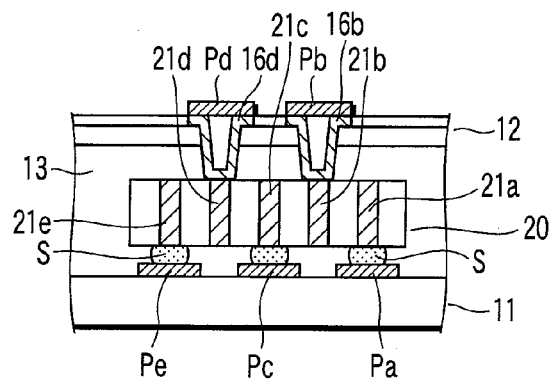

Next, a second embodiment of the present invention will be explained with reference to FIGS. 5A and 5B and FIGS. 6A and 6B. In the second embodiment, using the electrode connection structure of the built-in component 20 according to the first embodiment, a plurality of through-electrodes provided in the built-in component 20 are divided in two groups (for example, divided in two groups alternately in arrangement order), one group of the through-electrodes divided in two groups being joined to pads provided on the inner surface side of the first base member 11, and the other group of the through-electrodes divided in two groups being joined to via hole conductors provided in the second base member 12, so that the arrangement of the respective pads is free from a narrow pitch arrangement, and electrode joining faces thereof are expanded, which facilitates mounting of a built-in semiconductor component with, for example, multi-terminal geometry. Incidentally, FIGS. 5A and 6A are plan views showing arrangement relationships between through-electrodes 21a to 21e provided in the built-in component 20 and pads Pa, Pb, . . . Pe provided on the inner surface side of the first base member 11, and FIGS. 5B and 6B are partial side views showing arrangement relationships between the through-electrodes 21a, 21b, . . . 21e and the pads Pa, Pb, . . . Pe in one arrangement row.

FIGS. 5A and 5B show an arrangement relationship between the pads Pa, Pb, . . . Pe and the through-electrodes 21a, 21, . . . 21e in a case in which the pads Pa, Pb, . . . Pe connected to the through-electrodes 21a, 21b, . . . 21e are provided on the inner surface side of the first base member 11 corresponding to the through-electrodes 21a, 21b, . . . 21e provided in the built-in component 20. In the arrangement configuration, since the respective through-electrodes 21a, 21b, . . . 21e exposed on the one face of the built-in component 20 are joined to the pads Pa, Pb, . . . Pe provided on the inner surface side of the first base member 11 by, for example, solders S, respectively, pitches of the pads Pa, Pb, . . . Pe are restricted by pitches of the through-electrodes 21a, 21b, . . . 21e.

On the other hand, as shown in FIGS. 6A and 6B, the through-electrodes 21a, 21b, . . . 21e provided in the built-in component 20 are divided in two groups alternately in an arrangement order, for example, one group through electrodes 21a, 21c, . . . 21e of the divided two groups is joined to the pads Pa, Pc and Pe provided on the inner surface side of the first base member 11, and the other group through-electrodes 21b and 21d of the divided two groups are connected to the pads Pb and Pd provided on the second base member 12 via the via hole conductors 16b and 11d. In the example shown in FIGS. 6A and 6B, the pads Pa, Pc, and Pe of the pads Pa, Pb, . . . , Pe shown in FIGS. 5A and 5B are expanded in connection areas and provided on the inner surface side of the first base member 11, and the remaining pads Pb and Pd are expanded in connection areas and provided on the second base member 12 via the via hole conductors 16b and 16d. At this time, the pads Pa, Pc, and Pe are joined to the through-electrodes 21a, 21c, 21e exposed on the one face of the built-in component 20, and the pads Pb and Pd are joined via the conductors 16b and 16d to the through-electrodes 21b and 21d exposed on the other face of the built-in component 20.

As described above, by utilizing both exposed ends (both junction or connection faces) of the through-electrodes 21a, 21b, . . . 21e effectively and selectively allocating the pads Pa to Pe to be joined to the through-electrodes 21a to 21e, for electrode junction in a dispersing manner, the arrangement of the pads becomes free from a narrow pitch arrangement restricted by an arrangement pitch of the through-electrodes of the built-in component 20, so that both a pitch of the pads and a junction area of each pad can be expanded. Thereby, in particular, when an IC with a multi-terminal structure is used as a built-in component 20, mounting of the built-in component is facilitated, and since the junction area of the built-in component is expanded, the junction strength thereof can be increased.

Next, a third embodiment of the present invention will be explained with reference to FIGS. 7-12. The third embodiment shows an example in which a heat radiation mechanism is provided in a built-in component 20, as shown in FIG. 12. Here, by joining a through-electrode to an inner-layer heat radiating material made of aluminum core material or the like, cooling means of the built-in component 20 with a high heat-radiating effect is realized.

Manufacturing steps of a printed-wiring board according to the third embodiment are shown in FIGS. 7-12.

Figure 7:
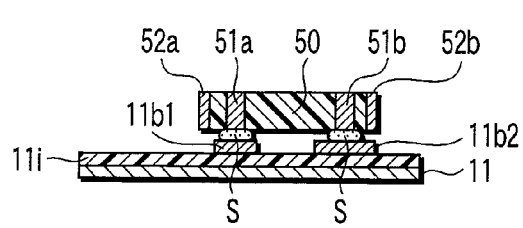

At a step 1 shown in FIG. 7, for example, according to a known reflow process, through-electrodes 51a and 51b of a built-in component 50 are joined to pads 11b1 and 11b2 provided on an inner surface or a component mounting face of a first base member 11 by solders S so that the built-in component 50 is fixedly mounted on the inner surface side of the first base member 11 via an insulating layer 11i. In the third embodiment, exposed electrodes 52a and 52b made of the through-electrodes are provided on both opposed side faces of the built-in component 50 to be mounted. The exposed electrodes 52a and 52b made of the through-electrodes can be formed by, for example, dicing machining the through-electrodes formed next to the electrodes 51a and 51b, respectively. At a manufacturing process of the built-in component or an IC 50, by aligning a dicing line passing at the center of the through-electrodes and performing dicing machining, the diced surface of the electrodes 52a and 52b made of the through-electrodes are exposed on the both opposed side faces of the built-in component 50 can be formed.

Figure 8:
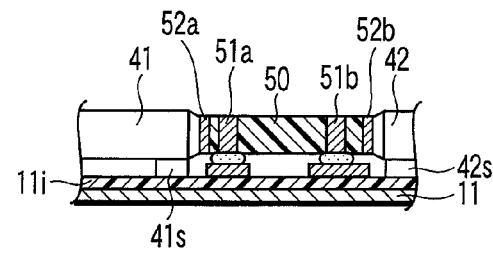

At a step 2 shown in FIG. 8, heat radiating members 41 and 42 using, for example, aluminum core material are provided on the insulating layer 11i supported by spacers 41S and 42S with an end joined to the exposed faces of the electrodes 52a and 52b made of the diced through-electrodes provided on the both opposed side faces of the built-in component 50, so that the heat radiating members 41 and 42 are mounted on the inner surface of the first base member 11.

Figure 9:
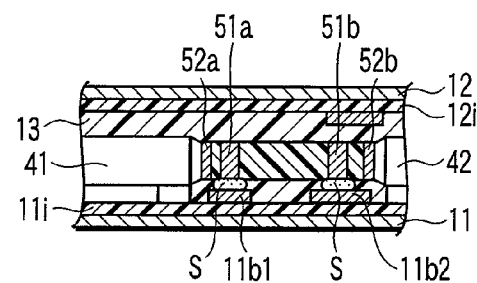

At a step 3 shown in FIG. 9, a second base member 12 is stacked on the first base member 11 via the insulating layers 12i and 13 to cover the upper surface of the built-in component 50.

Figure 10:
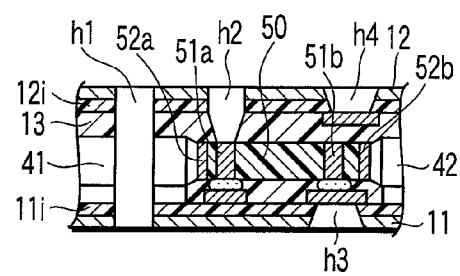

At a step 4 shown in FIG. 10, a hole part h2 communicating with the through-electrode 51a of the built-in component 50 is bored in the second base member 12 through the insulating layers 12i and 13. At step 4, for example, by laser machining (or drill machining), the hole part h2 communicating with the through-electrode 51a exposed on one face of the built-in component 50 is bored from the upper surface side of the second base member 12 toward the through-electrode 51a of the built-in component 50. Boring the hole part h2 is performed simultaneously at boring steps for respective hole parts h1, h3, and h4 of another through-hole, another via hole, and the like.

At a step 5 shown in FIG. 11, a through hole conductor 15 and via hole conductors 16, 17, and 18 are formed in the respective hole parts h1 to h4 in the printed-wiring board 10 by performing conductor plating (copper plating) to the respective hole parts h1 to h4. At step 5, the via hole conductor 16 joined to the through-electrode 51a exposed on the one face of the built-in component 50 is formed in the hole part h2 bored through the second base member 12. Further, the through hole conductor 15 extending through the first base member 11 and the second base member 12 is provided, the via hole conductor 17 joined to the pad 11b2 provided on the inner surface side of the first base member 11 is provided on the outer surface side of the first base member 11, and the via hole conductor 18 joined to the wiring pattern 12b1 provided on the inner surface side of the second base member 12 is provided on the outer surface side of the second base member 12. The via hole conductor 17 is joined to the pad 11b2 to which the through-electrode 51b of the built-in component 50 is joined by a solder S. Further, at the step 5, a solder resist isolation process is applied to a soldering part required on each wiring pattern.

At a step 6 shown in FIG. 12, for example, according to a known reflow process, an electrode 31 of an exterior component 30 is joined to the via hole conductor 16 by soldering so that the exterior component 30 is connected and mounted on the second base member 12. Thereby, the electrode 31 of the exterior component 30 and the through-electrode 51a of the built-in component 50 are directly circuit-connected to each other.

In this manner, in the printed-wiring board 10 according to the first embodiment shown in FIGS. 7-12, the heat radiation mechanism can be provided in the built-in component 20.

Next, with reference to FIG. 13, a fourth embodiment of the present invention will be explained. The fourth embodiment shows a configuration example in which a plurality of built-in components including through-electrodes are stacked by using the through-electrodes of the built-in components in the printed-wiring board. In the fourth embodiment, a first built-in component 20A is fixedly mounted on a first base member 11 via an insulating layer 111 by soldering each through-electrode 25 exposed on one face of the first built-in component 20A to pads 11b1, 11b2 provided on the inner surface side of the first base member 11, a second built-in component 20B is stacked on the first built-in component 20A by soldering each through-electrode 26 exposed on one face of the second built-in component 20B to the through-electrode 25 exposed on the other face of the first built-in component 20A via solders S, and one through-electrode 26 exposed on the other face of the second built-in component 20B is joined to a via hole conductor 16 provided in a second base member 12 and an insulating layer 12i. Incidentally, the first built-in component 20A and the second built-in component 20B may be subjected to stack processing in advance.

As described above, since the plurality of built-in components stacked by using the through-electrodes are provided in inner layers of the printed-wiring board, higher density in a functional circuit of the printed-wiring board can be achieved.

Figure 14:
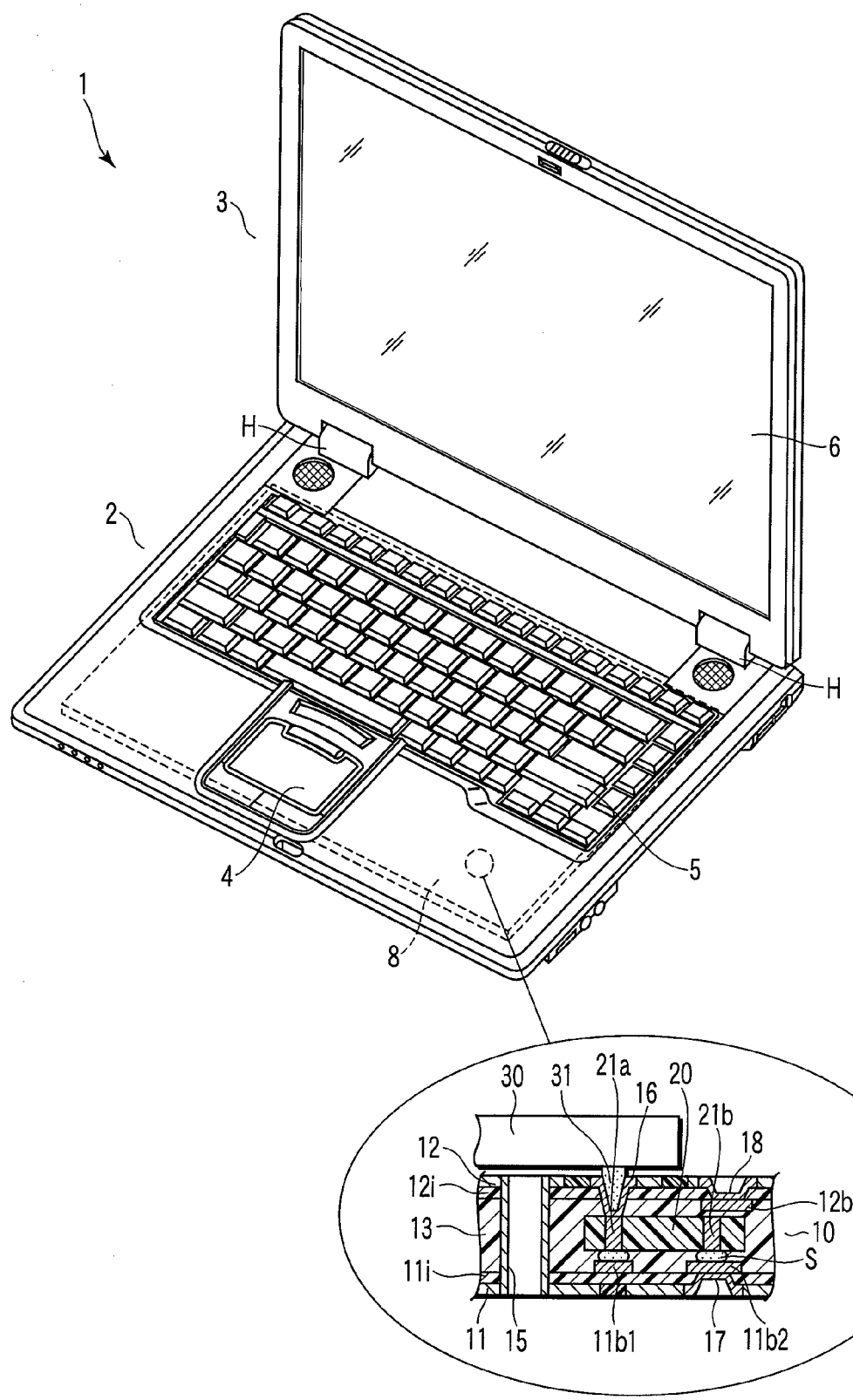

Next, a fifth embodiment of the present invention will be explained with reference to FIG. 14. The fifth embodiment configures an electronic equipment using the printed-wiring board manufactured according to the first embodiment. FIG. 14 shows an example in which the printed-wiring board according to the first embodiment is applied to a downsized electronic equipment such as a portable computer.

In FIG. 14, in a main body 2 of a portable computer 1, a displaying unit casing 3 is provided pivotally via a hinge mechanism H. Operating units such as a pointing device 4 and a keyboard 5 are provided in the main body 2. A display device 6 such as an LCD is provided in the displaying unit casing 3.

The main body 2 is provided with a circuit board (mother board) 8 in which a control circuit for controlling the operating units such as the pointing device 4 and the keyboard 5, and the display device 6 are incorporated. The circuit board 8 is realized by using the printed-wiring board of the first embodiment shown in FIG. 1, for example.

A part of the printed-wiring board 10 used for the circuit board 8 is enlarged and shown in FIG. 14 in which the board 10 comprises a first base member 11 including a component mounting inner face on which an insulating layer 13 is formed. A built-in component such as a semiconductor chip 20 having through-electrodes 21a and 21b is embedded in the insulating layer 13. The board 10 further includes a second base member 12 stacked on the first base member 11 via the semiconductor chip 20 and the insulating layers 12i and 13 covering the semiconductor chip 20, a via hole conductor 16 provided in the second base member 12 and provided in the via hole communicating with a through-electrode 21a, and an electronic component 30 mounted on the second base member 12 and circuit-connected directly to the through-electrode 21a via the via hole conductor 16. The circuit board 8 may be formed by the printed-wiring board according to any one of the described embodiments.

By configuring the circuit board 8 by using the printed-wiring board, a high density circuit in which interconnection between the memory chip configuring the built-in component 20 and the CPU chip configuring the exterior component (surface-mounted component) 30 is performed by direct circuit connection without requiring an extra wiring of a wiring pattern including a through hole can be mounted or realized.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A printed-wiring board, comprising:
   a first base member comprising a component mounting face;
   a first electronic component with a through-electrode mounted on the component mounting face;
   a second base member stacked on an insulating layer covering the first electronic component;
   a tapered, continuous via hole conductor provided in the second base member and in the insulating layer and communicating to communicate electrically with the through-electrode of the first electronic component; and
   a second electronic component mounted on the second base member and comprising an electrode electrically connected to the through-electrode by way of the tapered, continuous via hole conductor;
   wherein the first electronic component is a semiconductor chip component provided with a plurality of through-electrodes, and the location of the hole corresponds to a predetermined one of the plurality of through-electrodes;
   wherein the through-electrodes are divided into a first group of through-electrodes and a second group of through-electrodes, and wherein the first base member comprises a plurality of pads joined to the first group of the through-electrodes, and wherein the second base member comprises a plurality of vias joined to the second group of the through-electrodes.

2. The printed-wiring board according to claim 1, wherein a via conductor joined to the through-electrode is provided in the hole.

3. The printed-wiring board according to claim 1, wherein the through-electrodes are arranged at predetermined intervals, and divided into the first group of the through-electrodes and the second group of the through-electrodes alternately in arrangement order.

4. The printed-wiring board according to claim 1, wherein a plurality of semiconductor chips each being the first electronic component are stacked on and connected with each other via through-electrodes provided in the chips.

5. The printed-wiring board according to claim 2, wherein the via conductor is directly electrically connected to a pad provided on the first base member by way of the through-electrode.

6. The printed-wiring board according to claim 5, wherein the pad is an open pad which is not electrically connected to a wiring pattern provided on the first base member.

7. A manufacturing method of a printed-wiring board with a first electronic component, comprising:
   mounting the first electronic component on a first base member, the first electronic component having a through-electrode;
   stacking a second base member on an insulating layer covering the first electronic component;
   forming a tapered, continuous via hole conductor that communicates electrically with the through-electrode of the first electronic component in the second base member and in the insulating layer; and
   joining an electrode of a second electronic component to the through-electrode by way of the via hole conductor formed in the tapered, continuous via hole of the second base member and the insulating layer;
   wherein the first electronic component is a semiconductor chip component provided with a plurality of through-electrodes, and the location of the hole corresponds to a predetermined one of the plurality of through-electrodes;
   wherein the through-electrodes are divided into a first group of through-electrodes and a second group of through-electrodes, and wherein the first base member comprises a plurality of pads joined to the first group of the through-electrodes, and wherein the second base member comprises a plurality of vias joined to the second group of the through-electrodes.

8. An electronic device comprising:
   an electronic equipment main body, and a circuit board provided in the electronic equipment main body, wherein the circuit board comprises:
   a first base member including a component mounting face for a first electronic component;
   a semiconductor chip with a through-electrode mounted on the component mounting face;
   a second base member stacked on an insulating layer covering the semiconductor chip;
   a tapered, continuous via hole conductor provided in the second base member and in the insulating layer and communicating to communicate electrically with the through-electrode; and
   a second electronic component mounted on the second base member and comprising an electrode electrically connected directly to the through-electrode by way of the via hole conductor formed in the hole tapered, continuous via hole of the second base member and the insulating layer;
   wherein the first electronic component is a semiconductor chip component provided with a plurality of through-electrodes, and the location of the hole corresponds to a predetermined one of the plurality of through-electrodes;
   wherein the through-electrodes are divided into a first group of through-electrodes and a second group of through-electrodes, and wherein the first base member comprises a plurality of pads joined to the first group of the through-electrodes, and wherein the second base member comprises a plurality of vias joined to the second group of the through-electrodes.

* * * * *